(12) United States Patent
Inagawa et al.

(10) Patent No.: US 6,773,562 B1
(45) Date of Patent: *Aug. 10, 2004

(54) SHADOW FRAME FOR SUBSTRATE PROCESSING

(75) Inventors: Makoto Inagawa, Menlo Park, CA (US); Akihiro Hosokawa, Cupertino, CA (US); Richard E. Demaray, Portola Valley, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/026,575

(22) Filed: Feb. 20, 1998

(51) Int. Cl.[7] .............................................. C23C 14/34
(52) U.S. Cl. ........................ 204/298.15; 156/345.51; 118/728; 118/500; 118/503
(58) Field of Search ....................... 204/192.12, 192.15, 204/192.13, 192.26, 192.29, 298.03, 298.06, 298.08, 298.11, 298.15, 298.16, 298.17, 298.19, 298.2, 298.41; 118/728, 500, 503; 156/345, 345.51, 345.52, 345.53, 345.54

(56) References Cited

U.S. PATENT DOCUMENTS

| | | | |
|---|---|---|---|
| 4,853,102 A | * 8/1989 | Tateishi et al. | 204/298.15 |
| 5,316,645 A | * 5/1994 | Yamagami et al. | 204/298.06 |
| 5,352,294 A | 10/1994 | White et al. | 118/725 |
| 5,518,593 A | 5/1996 | Hosokawa et al. | 204/192 |
| 5,611,865 A | 3/1997 | White et al. | 118/725 |
| 5,665,167 A | * 9/1997 | Deguchi et al. | 118/728 |
| 5,716,486 A | * 2/1998 | Selwyn et al. | 204/298.15 |
| 5,728,276 A | * 3/1998 | Katsuki et al. | 204/298.11 |
| 5,827,408 A | * 10/1998 | Raaijmakers | 204/192.12 |

* cited by examiner

Primary Examiner—Gregg Cantelmo
(74) Attorney, Agent, or Firm—Moser, Patterson & Sheridan LLP

(57) ABSTRACT

A vacuum processing chamber with walls defining a cavity for processing a substrate. The processing chamber includes a substrate support for supporting a substrate being processed in the cavity, a shadow frame for preventing processing of a perimeter portion of the substrate, and a shadow frame support supporting the shadow frame within the cavity. The shadow frame is positionable with a gap between an underside of the shadow frame and an upper surface of the substrate. At least one conductive element insulated from the walls and establishes a conductive path from the shadow frame to outside the cavity. The conductive path may be used to discharge charge from the shadow frame at a rate sufficient to prevent a voltage differential from accumulating between the shadow frame and the substrate which would cause arcing therebetween, or to apply a bias voltage to the shadow frame sufficient to attract particles to reduce contamination of the substrate.

2 Claims, 5 Drawing Sheets

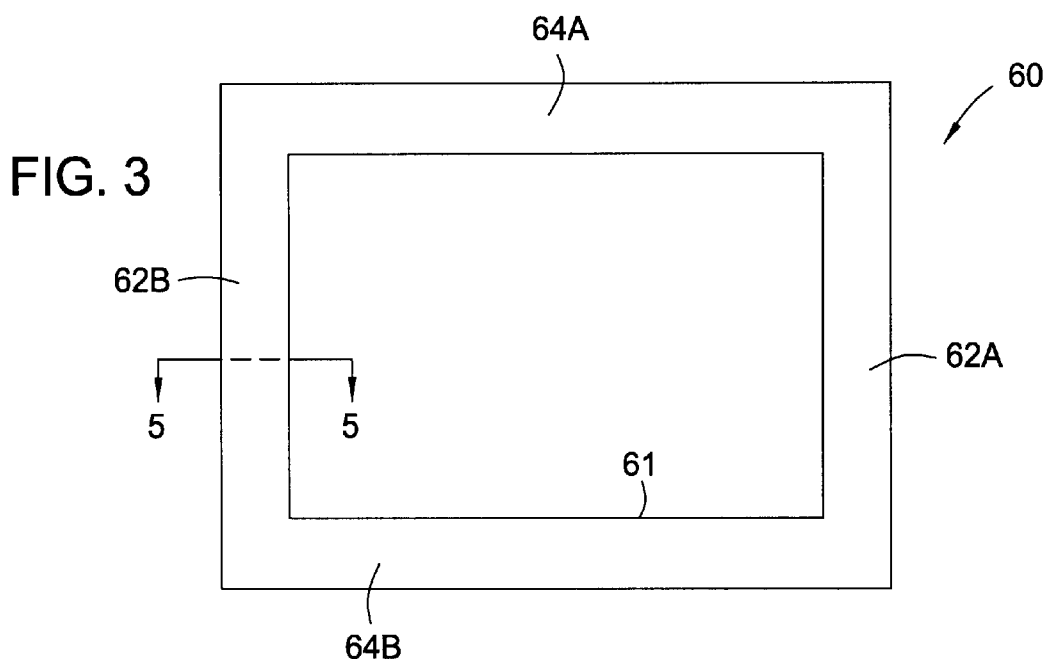
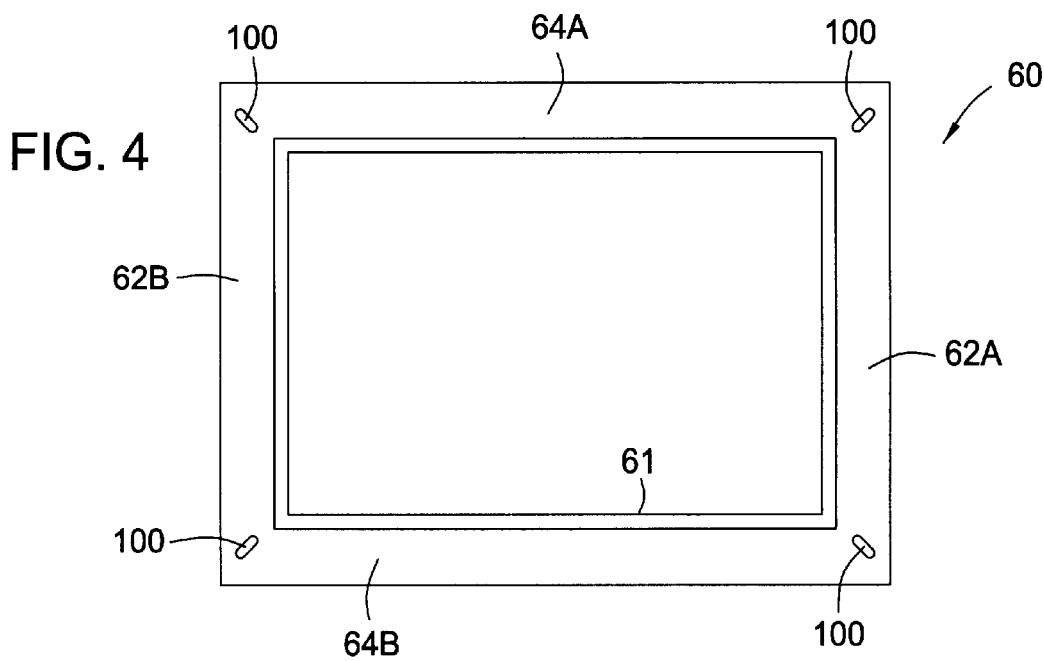
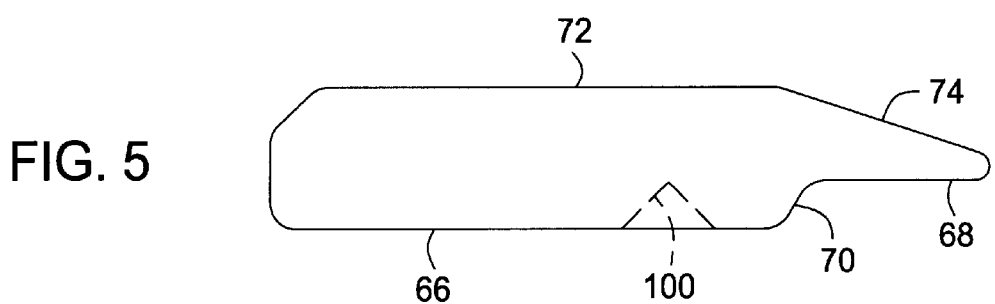

SHADOW FRAME FOR SUBSTRATE PROCESSING

TECHNICAL FIELD

This invention relates to semiconductor processing of substrates, and more particularly to shadow frames used to prevent deposition on the edge and backside of a substrate.

BACKGROUND

The semiconductor industry has been using single substrate (silicon wafer) processing chambers for some time because the chamber volume can be minimized, contamination of the substrate reduced, process control increased. Therefore, yields are improved. Further, vacuum systems have been developed, such as described in U.S. Pat. No. 4,951,601, that allow several sequential processing steps to be carried out in a plurality of vacuum processing chambers connected to a central transfer chamber, so that several processing steps can be performed on a substrate without its leaving a vacuum environment. This further reduces the possibility of contamination of the substrates.

Recently the interest in providing large glass substrates with active thin film transistors thereon for applications such as active matrix TV and computer displays has been heightened. These large glass substrates require vacuum processing chambers for deposition of thin films. The basic methods and processing chambers, e.g., plasma-enhanced chemical vapor deposition (PECVD), physical vapor deposition (PVD or "sputtering") etch chambers and the like, are similar to those used for depositing layers and patterning thin films on silicon wafers. A practicable system that can perform multiple process steps on glass substrates is disclosed by U.S. Pat. No. 5,512,320, hereby incorporated by reference. However, because of the large size of the glass substrates, several problems have been noted in their handling and processing in vacuum processing chambers.

During processing, the edge and backside of the glass substrate must be protected from deposition. A deposition-masking rectangle or shadow frame is placed about the periphery of the substrate to prevent processing gases or plasma from reaching the edge and backside of the substrate in a CVD chamber for example. The susceptor, with a substrate mounted thereon, can have a shadow frame which will surround and cover several millimeters of the periphery of the front surface of the substrate. This will prevent edge and backside deposition on the substrate. If, however, the shadow frame is not properly centered with respect to the substrate during processing, the amount of shadowing that occurs on each edge of the substrates will be unequal and unacceptable.

In substrate processing in general, and in PVD (sputtering) processing in particular, particulates which are present and are generated in the processing chamber can contaminate and destroy the substrate being processed. When such particulates (also known as "free" particulates) land on the substrate being processed, they contaminate a small area of the substrate which can be discarded if the substrate is die cut into separate chips. However, when a large substrate is intended for subsequent use as a single item (e.g. as a flat panel display), one defect causes the whole unit to be rejected.

The contaminating particulates originate from several sources. Incomplete or defective cleaning of the chamber allows particulates to remain in the chamber and cause contamination. However, even when the processing chamber is clean, contaminants can be and are generated during the sputtering process. One type of contaminating particulate originates from sputter deposited material which has deposited itself on processing chamber surfaces other than the substrate intended for deposition, and subsequentially detaches (peels off or falls off) from the location inside the vacuum processing chamber where it originally had been deposited. These particulates are usually cool, multi-molecular sized specks of sputter deposited material which were hot during the sputtering process, but have since cooled as a result of their contact with surrounding surfaces. However, unlike the hot material being sputter deposited when the cool specks (particulates) land on and are embedded in the substrate, they can create defects which cause rejection of the substrate.

Another source of particulates is electrical arcing between the highly charged (biased) target and its surrounding uncharged (grounded) pieces. Arcing occurs in PVD processing chambers at locations between the edge of the target and surrounding surfaces (usually a shield enclosing the target and protruding into the space adjacent to the target which is known as "the dark space ring or groove"). Arcing between adjacent pieces causes a severe localized temperature spike which in most cases releases molecules of one or both of the materials between which the spark arcs. If the released molecules settle on the substrate, at best, they create a slight but acceptable anomaly in the coating pattern, or at worst when a particulate is a foreign material, the substrate will be contaminated and will have to be rejected.

SUMMARY

In one aspect, the invention is directed to a vacuum processing chamber. The chamber has walls defining a cavity for processing a substrate, a substrate support for supporting a substrate being processed in the cavity, a shadow frame for preventing processing of a perimeter portion of the substrate, and a shadow frame support supporting the shadow frame within the cavity. The shadow frame is positionable with a gap between an underside of the shadow frame and an upper surface of the substrate, and the shadow frame support has at least one conductive element insulated from the walls and establishing a conductive path from the shadow frame to outside the cavity.

Implementations of the invention may include the following. The substrate support may include a susceptor having an upper surface to support the substrate, and a plurality of lift pins vertically movable relative to the susceptor to contact the underside of the substrate to support the substrate. A bias voltage source may be coupled to the conductive element and configured to apply a bias voltage to the shadow frame selected to prevent arcing between a portion of the substrate being processed and the shadow frame. The bias voltage source may be configured to apply a second bias voltage to the shadow frame to attract charged particles, released by termination of a plasma within the chamber, to the shadow frame, so that there is a preferential accumulation of such particles on the shadow frame relative to the substrate. A voltage measurement device may be coupled to the conductive element and configured to measure a voltage of the shadow frame. A grounding circuit may couple the conductive element to ground, and it may be configured so as to discharge a first charge accumulated by the shadow frame during processing. The discharge may maintain the shadow frame at a potential sufficient to substantially prevent arcing between the shadow frame and the substrate. The grounding circuit may include a resistor to continuously discharge charge accumulated by the shadow frame, a switch connecting the at least one conductive element to ground, a voltage measurement device configured to close the switch if the charge on the shadow frame exceeds a threshold, or a control system configured to close the switch after a predetermined number of substrates have been processed. The conductive element may be a height-adjustable generally vertical member, which may be adjusted to determine the height of the shadow frame within the cavity. The shadow frame support includes a mounting flange insulated from the conductive element. The height-adjustable member may include an upper member having an at least partially cone-shaped upper end in physical and electrical contact with a mating feature in an underside of the shadow frame and a lower end having a threaded central aperture, a lower member having an externally threaded upper portion in threaded engagement with the threaded central aperture of the upper member, and a lock nut in threaded engagement with the externally threaded upper portion and configured to bear against the lower end of the upper member to lock the upper member relative to the lower member. The support may be movable in a vertical direction to move the substrate between a loading height and a processing height, above the loading height;

In another aspect, the invention is directed to a process for sputter deposition from a sputtering target onto a surface of a substrate positioned in a processing region of a vacuum chamber. In the process, a plasma is generated between the target and the surface of the substrate, material is sputtered from the target onto the surface of the substrate to form sputter deposited material thereupon, the generation of the plasma is terminated as to release particles having a charge, and a bias voltage is applied to a shadow frame sufficient to attract at least a portion of the particles to the shadow frame, whereby the portion of the particles does not contaminate the surface of the substrate.

Implementations of the invention may include the following. The plasma may be moved between first and second positions in the vacuum chamber by moving a magnet in a magnet region of the vacuum chamber between a home position and a remote position at extremes of a range of the magnet. The step of applying a bias voltage may occur while the magnet is substantially at said home position. The sputtering step may be performed with a substantial quantity of argon gas in the vacuum chamber and the bias voltage may be a positive voltage.

In another aspect, the invention is directed to a process for sputter deposition from a sputtering target onto a surface of a substrate positioned in a processing region of a vacuum chamber. In the process a plasma is generated between the target and the surface of the substrate, material is sputtered from the target onto the surface of the substrate to form sputter deposited material thereupon, and the generation of the plasma is terminated. Charge is discharged from a shadow frame at a rate sufficient to maintain the shadow frame at a potential that substantially prevents arcing between the shadow frame and the substrate.

Implementations of the invention may include the following. The charge may be discharged continuously through a resistor. The voltage of the shadow frame may be measured, and the charge may be discharged when the measured voltage exceeds a threshold. The charge may be discharged after a predetermined number of substrates have been processed.

In another aspect, the invention is directed to a vacuum processing chamber. The chamber has walls defining a cavity for processing a substrate within the cavity, a substrate support for supporting the substrate being processed in the cavity, a shadow frame for preventing processing of a perimeter portion of a substrate, and a shadow frame support supporting the shadow frame within the cavity. The shadow frame is positionable with a gap between an underside of the shadow frame and an upper surface of the substrate, and the shadow frame support has a plurality of conductive elements insulated from the walls and establishing at least one conductive path from the shadow frame to outside the cavity in order to discharge charge from the shadow frame at a rate sufficient to prevent a voltage differential from accumulating between the shadow frame and the substrate which would cause arcing therebetween.

Among the advantages of the invention are the following. Arcing between the substrate and the shadow frame may be reduced, thereby decreasing the accumulation of contaminating particles on the substrate.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

FIG. 3 is a top view of a shadow frame from the chamber of FIG. 1.

FIG. 4 is a bottom view of the shadow frame of FIG. 3.

FIG. 5 is a cross-sectional view of the shadow frame of FIG. 3 taken along line 5—5.

Like reference numbers and designations in the various drawings indicate like elements.

DETAILED DESCRIPTION

As noted, a problem with prior art systems in which the shadow frame is grounded (e.g., through electrical contact with the susceptor) is arcing between the substrate and the shadow frame. Such arcing is a particular problem in the processing of insulative substrates such as glass rather than semiconductor substrates because the latter type of substrate effectively grounds the deposited layers to the susceptor whereas the former insulates the two and allows the deposited layers to accumulate charge. Discharge of such charge produces the arcing and damages the substrate involved and generates particles which may adversely effect the processing of subsequent substrates.

In one attempted solution to the arcing problem, a shadow frame may be supported within the chamber in such a way as to electrically float. However, in experiments with an electrically floating shadow frame, arcing was nevertheless observed. The observed arcing occurred after a number of depositions, e.g., approximately every tenth substrate. Without being limited to any particular theory, one possible explanation is that arcing occurs toward the end of or after deposition on a substrate when the deposited layers on the upper surface of the substrate accumulate sufficient negative charge to arc to the shadow frame. With a floating shadow frame, however, the shadow frame itself picks up a negative charge and, once sufficient charge has been accumulated, when a fresh substrate is introduced to the chamber, arcing may occur between the shadow frame and the substrate before the substrate has accumulated charge of the same sign as that on the shadow frame.

In a floating shadow frame, the bulk of the charge acquisition by the shadow frame appears to occur after termination of deposition (e.g., when flow of reactive gases and plasma generation are terminated). By way of example, in one process commenced with a shadow frame initially uncharged, the shadow frame quickly picked up a negative charge of approximately −30–40V. After deposition was terminated, the negative charge further increased in magnitude to below −250V.

Another problem is that in certain systems there is a particle accumulation on the upper surface of the substrate adjacent one edge. This may be associated with the home position of a magnet used in plasma generation. In such systems, the magnet reciprocates from side to side over the substrate with a target interposed between the substrate and magnet. A plasma is generated between the target and substrate to facilitate deposition. It is in the home position (typically above one edge of the substrate) that generation of the plasma is initiated and terminated at the beginning of and end of deposition. One possible explanation is that negatively charged particles trapped in the plasma fall to the substrate when the plasma is terminated.

Figure 1:
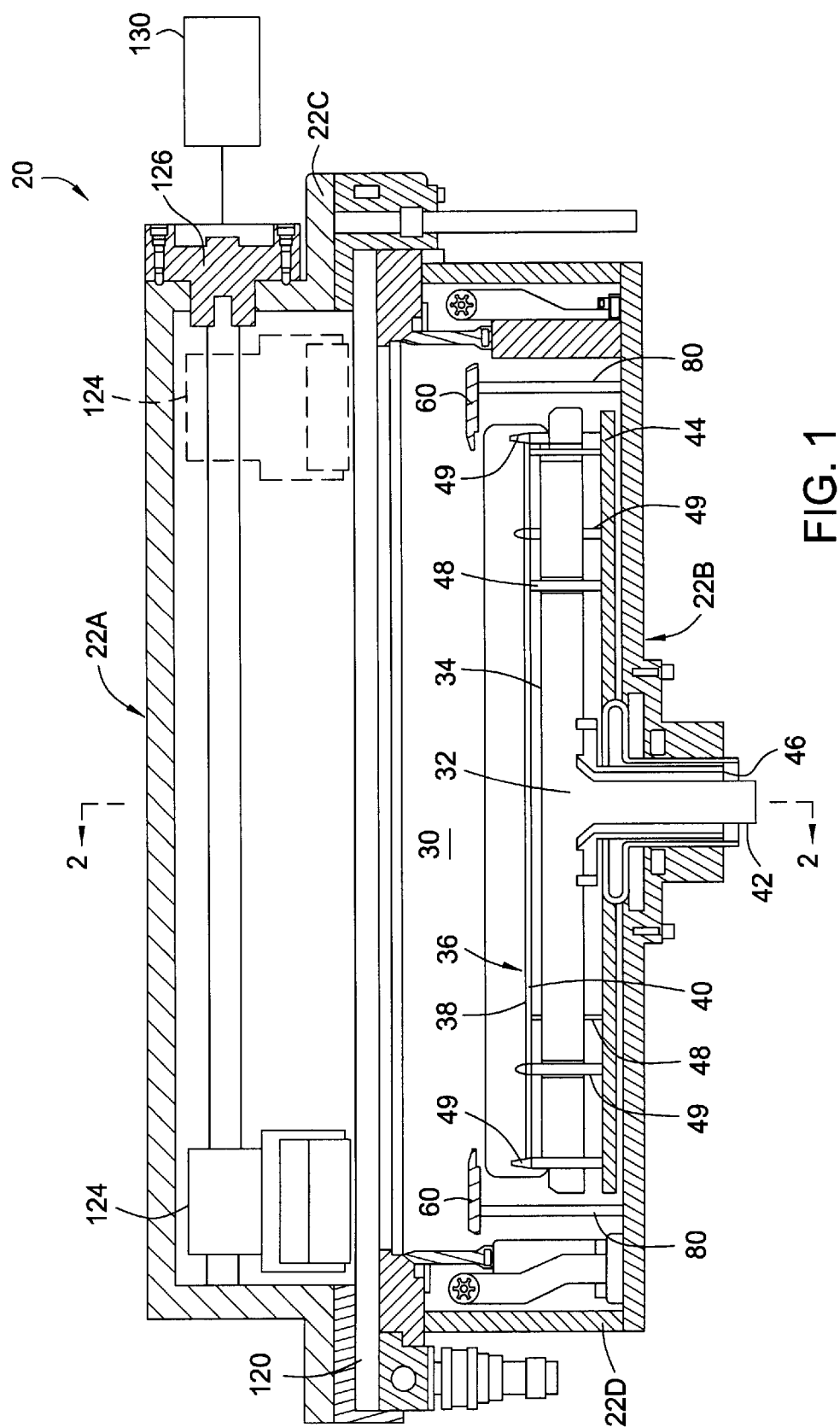
FIG. 1 is a cross-sectional view of a processing chamber according to the invention.
Figure 2:
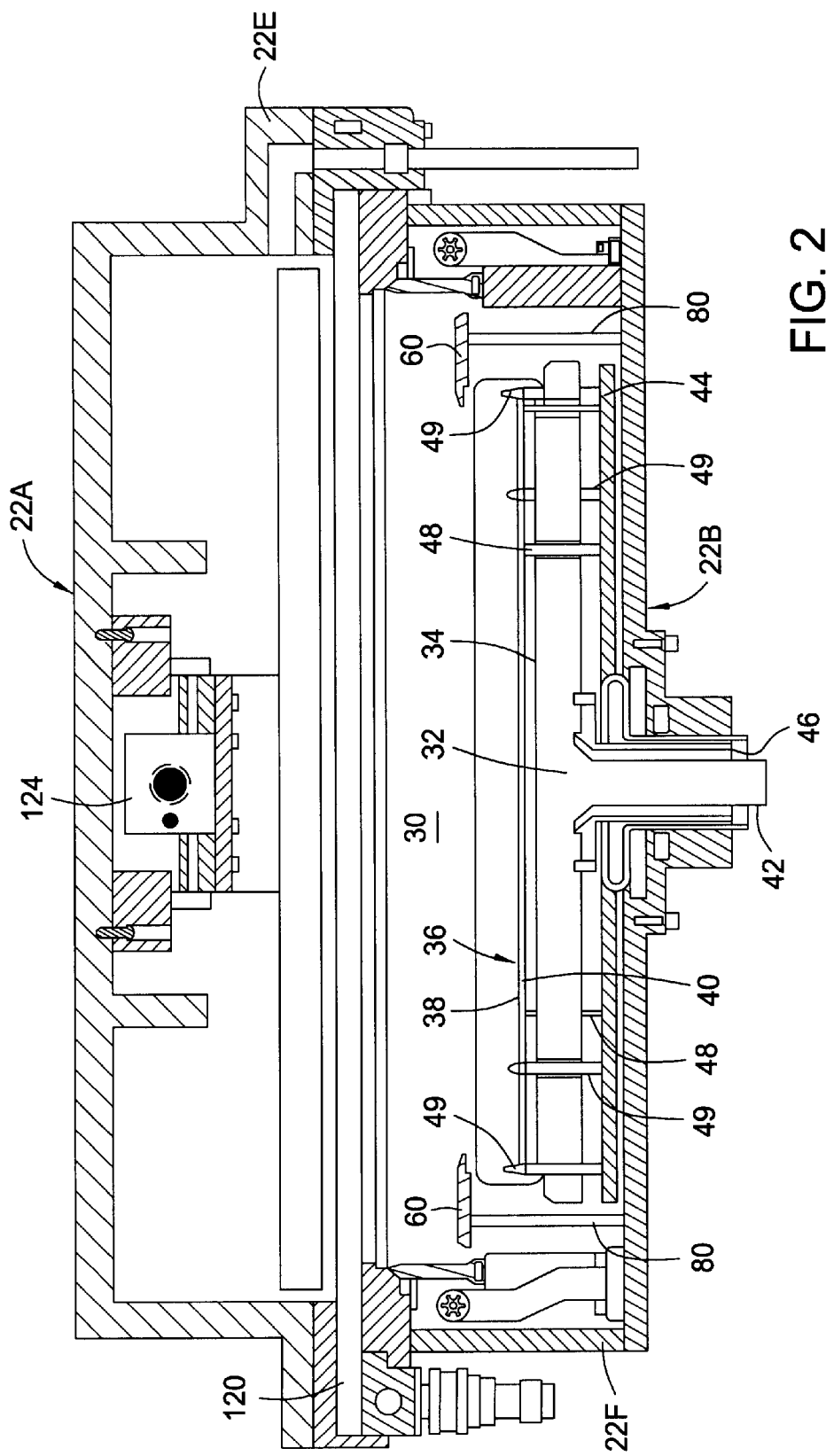
FIG. 2 is a cross-sectional view of the chamber of FIG. 1.

As shown in FIGS. 1 and 2, a processing chamber 20 has a plurality of walls 22A–22F which bound and define a cavity 30 in which substrates may be processed. Substrate ingress and egress may be provided through one or more gate valves (not shown). A susceptor 32 which may generally be formed as a rectangular plate, has a flat central upper surface portion 34 for supporting a substrate 36 during processing. The substrate has an upper surface 38 on which material is to be deposited, a lower surface or underside 40, and a perimeter comprising the four edges of the substrate. A central shaft 42 depends from the susceptor and serves as a pedestal for supporting the susceptor to raise and lower the susceptor as described below. A pin plate 44 is located below the susceptor 32 and is supported by a sleeve 46 encompassing the shaft 42 and mounted to permit the pin plate to be raised independently of the susceptor. Extending upward from the pin plate are a plurality of lift pins 48 and alignment pins 49 accommodated by apertures in the susceptor. The upper ends or tips of the lift pins are configured to contact the underside of a substrate to hold the substrate elevated above the susceptor during transfer of the substrate to and from the chamber by a robot (not shown). During transfer, the end effector (also not shown) of the robot is accommodated between the susceptor and underside of the substrate, passing laterally around the lift pins.

In operation, the end effector introduces the substrate to the chamber through a gate valve. With the lift pins protruding through the upper surface of the susceptor, the combined susceptor and pin plate are elevated slightly. If the substrate is not laterally aligned with its target position, the elevation causes the angled sides of one or more of the alignment pins 49 to contact the substrate perimeter and shift the substrate laterally toward the target position. As the lift pins are raised to an intermediate stage of elevation, the lift pins 48 contact the underside of the substrate and raise the substrate slightly above the end effector. The end effector may then be withdrawn. Finally, the susceptor may be further raised (absolutely and relative to the pin plate) to lift the substrate off the lift pins (the lift pins receding into the apertures within the susceptor) and raise the substrate to a processing height (see FIG. 7).

Figure 7:
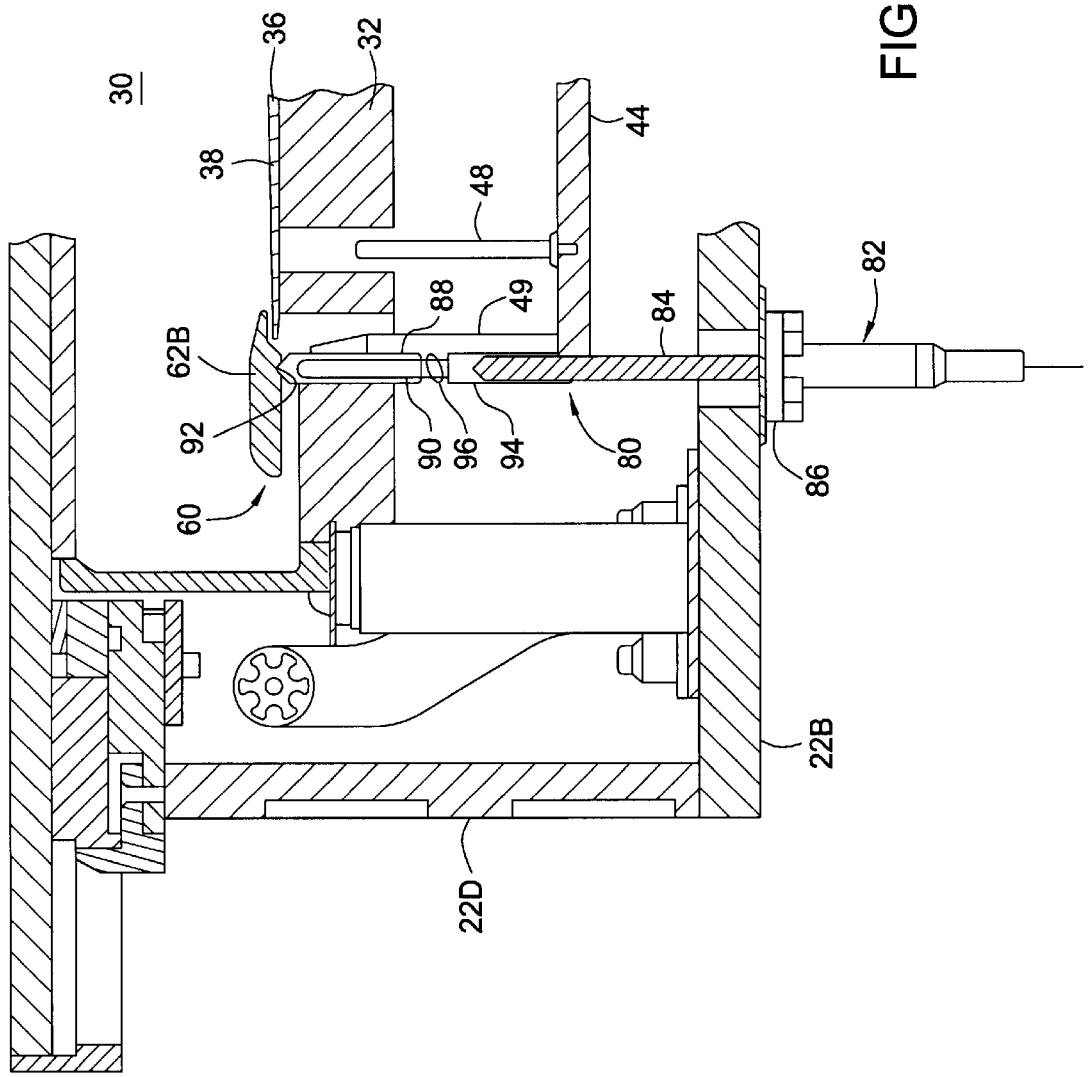
FIG. 7 is a detailed cross-sectional view of the processing chamber of FIG. 1 with the susceptor at a processing height.

When the substrate is at the processing height as shown in FIG. 7, a perimeter portion of the upper surface of the substrate is in close parallel relation to an inboard edge of the underside of a shadow frame 60. As described below in greater detail, the shadow frame 60 is discharged at a rate sufficient to prevent a large voltage differential from accumulating betweeen the shadow frame and the substrate so as to substantially prevent arcing therebetween.

As shown in FIGS. 3 and 4, the shadow frame 60 is formed in rectangular shape with a central aperture 61 as the unitary combination of side members 62A, 62B, 64A and 64B. In the illustrated embodiment, the side members 62A and 62B are shorter than the members 64A and 64B and are designated as ends. The side members 62A, 62B, 64A, and 64B have substantially identical overall cross-section. As shown in FIG. 5, the lower surface of each side member has a generally flat outboard portion 66 and a generally flat inboard portion 68, separated from the outboard portion by an angled bevel or shoulder 70. The inboard portion 68 is dimensioned to overlie (with a slight gap) the substrate adjacent the substrate 36 perimeter during processing (see FIG. 7). The upper surface of each member 62A, 62B, 64A, 64B has a generally flat outboard portion 72 parallel to the outboard portion 66 and a generally flat inboard portion 74 angled downward from the outboard portion 72 to reach close proximity with the inboard portion 68 adjacent the central aperture of the frame.

Figure 6:
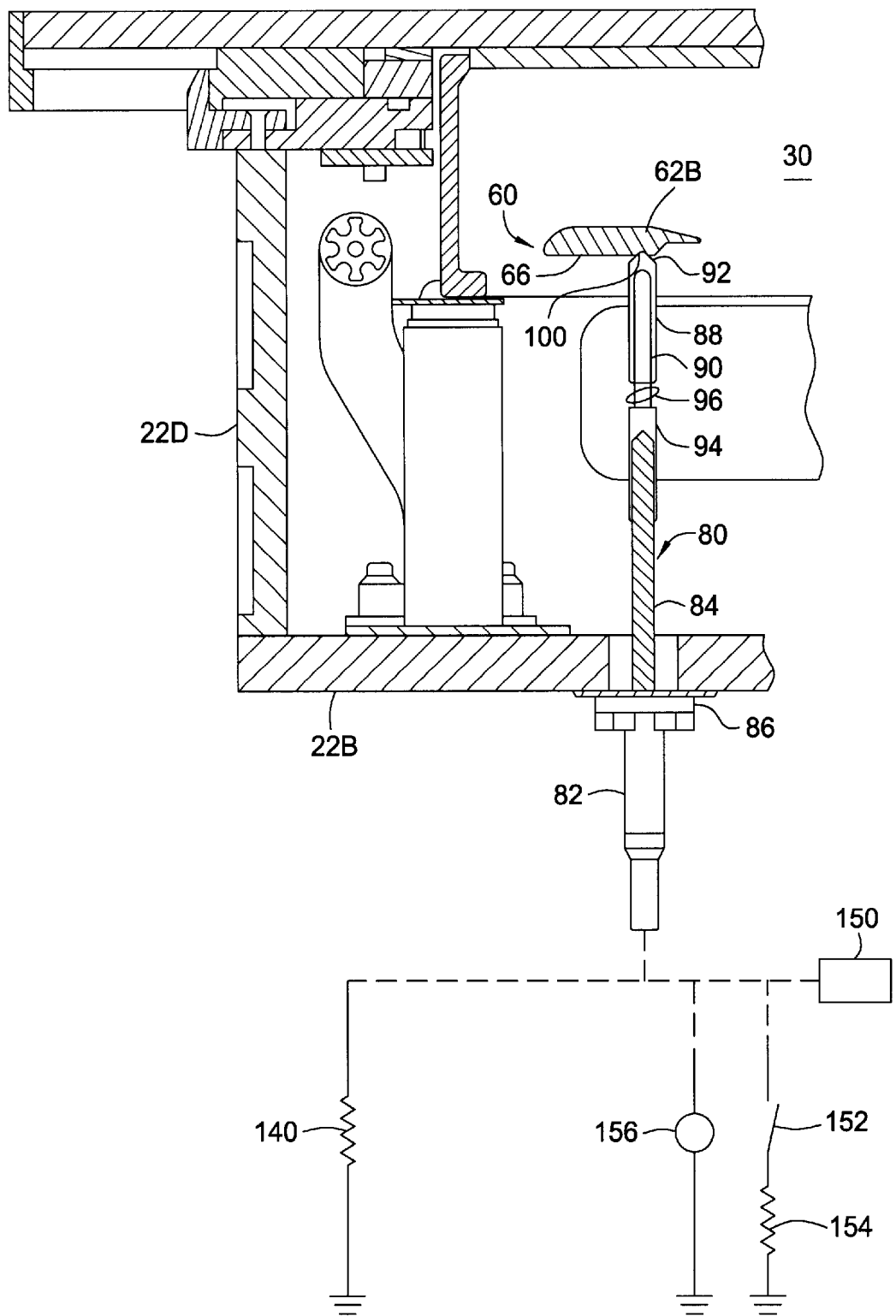
FIG. 6 is partially a detailed cross-sectional view of the processing chamber of FIG. 1 with a susceptor at a loading height, and partially a schematic circuit diagram.

Referring to FIG. 6, the shadow frame is supported by four supports 80 which contact the underside of the shadow frame. Each support 80 includes an electrical feedthrough 82 having a vertically extending conductor/shaft 84 and a mounting flange 86 electrically insulated from the shaft 84. The flange 86 is secured to the underside of the bottom wall 22B of the chamber with the shaft 84 extending through an aperture in such wall and into the cavity 30. In the illustrated embodiment, the feedthrough 82 may be provided by a high voltage, medium current feedthrough, e.g., available from MDC Vacuum Products, Inc., of Haywood, Calif. In the illustrated embodiment, spanning between the shaft 84 and the shadow frame 60 each support 80 includes an adjustable engagement member 88 having an internally threaded stainless steel distal tip portion 90. The upper end of the tip 90 has a conical surface 92 for engaging the shadow frame. The tip 90 has an internally threaded aperture extending upward from its lower end which receives a mating externally threaded upper portion of a proximal extension portion 94. The extension 94 has an aperture extending upward from its lower end, into which the upper portion of the shaft 84 is press fit. A lock nut 96 rides on the threaded upper end of the extension 94 and may be tightened against the bottom end surface of the tip 90 to lock the tip 90 in place. By rotation of the tip 90 relative to the extension 94, the tip 90 may be raised and lowered to establish a preferred height for the shadow frame to accommodate substrates of different thickness and/or vary the gap between the substrate and frame and/or vary the gap between the substrate and the target. Each conical surface 92 rides in an associated elongated conical slot 100 in the lower outboard surface portion 66 of the shadow frame. In the illustrated embodiment, there are four slots 100 (FIG. 4) aligned so as to converge in the center of the shadow frame. With thermal expansion or contraction of the shadow frame relative to the remainder of the chamber, the conical surfaces 92 may slide within the slots 100.

A sputtering target 120 is provided in the chamber above the shadow frame and substrate. As shown in FIGS. 1 and 2, the target 120 divides the chamber in two, defining a magnet chamber portion above the target and a reaction portion below the target. The target is generally rectangular and of somewhat greater area than the substrate and the susceptor. A magnet 124 is carried above the target 120 via a drive mechanism 126 and may be reciprocated over the target between a first or home position proximate one side of the chamber (shown in solid lines in FIG. 1) and a second position proximate an opposite side of the chamber (shown in broken lines in FIG. 1). The drive mechanism may be coupled to a control system 130 which also controls the movement of the susceptor, pin plate, valves, plasma generator, vacuum pumps, reactant gas supplies, and other elements of the system.

In operation, a gas (e.g., argon) is introduced into the processing chamber and the gas molecules are ionized as a result of a combination of magnetic field and DC power. Once ionized, the gas molecules bombard the sputtering target 120, causing the target material to be released into chamber 30 as molecular size ballistic particles. The particles of the target material then travel through the chamber to bombard and accumulate on the substrate 36. In addition, the plasma may be moved in the vacuum chamber by moving a magnet in the magnet region of the vacuum chamber between a home position and a remote position (shown in phantom).

Referring to FIG. 6, in one embodiment, the conductors or conductor shafts 84 may be linked to ground via a resistor 140. An individual resistor 140 may be associated with each feedthrough 82 or a single resistor may be connected to more than one feedthrough. The value of the resistor(s) is chosen to allow a gradual discharge of charge from the shadow frame. The rate of discharge is such to maintain the shadow frame at a potential sufficient to substantially prevent arcing between the shadow frame and the substrate. Specifically, the rate of discharge is fast enough to prevent so much charge from accumulating on the shadow frame so that the potential of the shadow frame sufficiently below the potential of the substrate that arcing occurs, but slow enough that if the substrate acquires additional negative charge during processing, the potential of the substrate will not drop so far below the potential of the shadow frame that arcing occurs. In one exemplary application, the value of the resistor may be chosen so that during sequential processing, the shadow frame remains at a potential of approximately −30V or such other amount as may be sufficient to avoid arcing between the shadow frame and a substrate that acquires a negative charge of even greater magnitude.

In another embodiment shown in FIG. 6, the conductor may be coupled to voltage measurement equipment 150 (which may be included in the control system 130) to monitor the charge accumulation of the shadow frame. When the charge exceeds a certain amount, the charge may entirely or partially be discharged to ground such as via a switch 152 which may be directly coupled to ground or may be coupled to ground via a resistor 154. Alternatively, the discharge to ground may be initiated after a predetermined number of substrates have been processed, which predetermined number is less than the number of sequential substrates being processed which would be expected to induce arcing.

In a further embodiment shown in FIG. 6, shaft/conductors 84 may be coupled to a voltage source 156 to maintain the shadow frame at a bias voltage. For example, the bias voltage could be a −30V DC potential. The bias voltage may be selected by the user to be appropriately related to the extremes of voltage of the deposited layers on the upper surface of the substrate so that arcing does not occur at any point during processing. In the exemplary application, the extremes may be about from a voltage of between −200V to −300V after processing and approximately neutral voltage at the beginning of processing. In this embodiment, a second opposite bias voltage may be briefly applied to the shadow frame upon termination of the plasma to prevent the particles in the plasma from falling to the substrate. In the exemplary application, if, contemporaneously with terminating the plasma, the shadow frame is raised to +30V, negatively charged particles trapped in the plasma will be drawn to the shadow frame rather than to the substrate. In still another exemplary application, the bias voltage is applied while the magnet is at the home position.

A number of embodiments of the present invention have been described. Nevertheless, it will be understood that various modifications may be made without departing from the spirit and scope of the invention. For example, the invention may be adapted for use with a variety of chamber configurations. Various parameters may be influenced by and optimized for the particular chamber involved and process being performed. Accordingly, other embodiments are within the scope of the following claims.

What is claimed is:

1. A vacuum processing chamber having walls defining a cavity for processing a substrate within the cavity, comprising:
   a substrate support for supporting the substrate being processed in the cavity;
   a shadow frame for preventing processing of a perimeter portion of a substrate, the shadow frame positionable with a gap between an underside of the shadow frame and an upper surface of the substrate;
   a shadow frame support supporting the shadow frame within the cavity and having a plurality of conductive elements insulated from the walls and establishing at least one conductive path from the shadow frame to outside the cavity in order to discharge charge from the shadow frame at a rate sufficient to prevent a voltage differential from accumulating between the shadow frame and the substrate which would cause arcing therebetween.

2. A vacuum processing chamber having walls defining a cavity for processing a substrate within the cavity, comprising:
   a substrate support for supporting a substrate being processed in the cavity;
   a shadow frame for preventing processing of a perimeter portion of the substrate, the shadow frame positionable with a gap between an underside of the shadow frame and an upper surface of the substrate;
   a shadow frame support supporting the shadow frame within the cavity and having at least one conductive element insulated from the walls and establishing a conductive path from the shadow frame to outside the cavity;
   a bias voltage source coupled to the at least one conductive element and configured to apply first and second bias voltages to the shadow frame;
   the first bias voltage selected to prevent arcing between a portion of the substrate being processed and the shadow frame; and
   the second bias voltage selected to attract charged particles, released by termination of a plasma within the chamber, to the shadow frame, so that there is a preferential accumulation of such particles on the shadow frame relative to the substrate.

* * * * *

UNITED STATES PATENT AND TRADEMARK OFFICE
CERTIFICATE OF CORRECTION

PATENT NO. : 6,773,562 B1  
DATED : August 10, 2004  
INVENTOR(S) : Makoto Inagawa, Akihiro Hosokawa and Richard E. Demaray Page 1 of 1

It is certified that error appears in the above-identified patent and that said Letters Patent is hereby corrected as shown below:

Column 4,
Line 28, after "FIG. 1" insert -- taken along line 2—2 --.

Column 5,
Line 42, delete "32" and insert -- 38 --.

Signed and Sealed this

Fifth Day of July, 2005

JON W. DUDAS
*Director of the United States Patent and Trademark Office*